United States Patent
Yasukawa et al.

(10) Patent No.: US 7,425,789 B2
(45) Date of Patent: Sep. 16, 2008

(54) POWER SUPPLY APPARATUS, AND IMAGE FORMING APPARATUS HAVING THE SAME

(75) Inventors: Kouji Yasukawa, Susono (JP); Hiroshi Mano, Numazu (JP); Atsuhiko Yamaguchi, Izu (JP); Osamu Nagasaki, Numazu (JP)

(73) Assignee: Canon Kabushiki Kaisha, Tokyo (JP)

( * ) Notice: Subject to any disclaimer, the term of this patent is extended or adjusted under 35 U.S.C. 154(b) by 485 days.

(21) Appl. No.: 11/275,636

(22) Filed: Jan. 20, 2006

(65) Prior Publication Data
US 2006/0273688 A1 Dec. 7, 2006

(30) Foreign Application Priority Data
Jun. 6, 2005 (JP) ............................. 2005-166166

(51) Int. Cl.
*H01L 41/107* (2006.01)
(52) U.S. Cl. ..................................................... 310/318
(58) Field of Classification Search ................ 310/318, 310/319, 316.01, 359, 317, 315; 323/355; H01L 41/08, H01L 41/107
See application file for complete search history.

(56) References Cited

U.S. PATENT DOCUMENTS

| | | | | |
|---|---|---|---|---|
| 5,654,605 A | * | 8/1997 | Kawashima | ................. 310/318 |
| 5,942,835 A | * | 8/1999 | Furuhashi et al. | ....... 310/316.01 |
| 6,107,620 A | | 8/2000 | Shiba et al. | .................. 250/214 |
| 6,229,721 B1 | | 5/2001 | Mano et al. | .................... 363/56 |
| 7,122,939 B2 | * | 10/2006 | Chou et al. | .................. 310/318 |
| 2006/0220495 A1 | | 10/2006 | Yamaguchi et al. | ......... 310/318 |
| 2006/0222398 A1 | | 10/2006 | Nagasaki et al. | .............. 399/88 |

FOREIGN PATENT DOCUMENTS

JP 11-206113 7/1999

* cited by examiner

*Primary Examiner*—Darren Schuberg
*Assistant Examiner*—Karen B Addison
(74) *Attorney, Agent, or Firm*—Fitzpatrick, Cella, Harper & Scinto (57) ABSTRACT

A power supply apparatus includes a piezoelectric transformer which outputs a voltage, a voltage-controlled oscillator which controls the frequency of an output signal in accordance with an input control signal, a power supply voltage supply element which is driven by a signal output from the voltage-controlled oscillator and applies a power supply voltage to the piezoelectric transformer, and an output voltage stop circuit (118) which outputs a signal for stopping driving the piezoelectric transformer on the basis of a control signal (Vcont).

20 Claims, 8 Drawing Sheets

POWER SUPPLY APPARATUS, AND IMAGE FORMING APPARATUS HAVING THE SAME

FIELD OF THE INVENTION

The present invention relates to a power supply apparatus suitable for an image forming apparatus which forms an image by an electrophotographic process and, more particularly, to a power supply apparatus using a piezoelectric transformer and an image forming apparatus including the power supply apparatus.

BACKGROUND OF THE INVENTION

When an image forming apparatus which forms an image by an electrophotographic process adopts a direct transfer system of transferring an image by bringing a transfer member into contact with a photoconductor, the transfer member uses a conductive rubber roller having a conductive rotating shaft. The transfer member is driven to rotate to match the process speed of the photoconductor.

A voltage applied to the transfer member is a DC bias voltage. At this time, the polarity of the DC bias voltage is identical to that of a transfer voltage for general corona discharge. To achieve satisfactory transfer using the transfer roller, a voltage of generally 3 kV or more (required current is several μA) must be applied to the transfer roller. This high voltage necessary for the above image forming process is conventionally generated using a wire-wound electromagnetic transformer. The electromagnetic transformer is made up of a copper wire, bobbin, and core. When the electromagnetic transformer is used in application of a voltage of 3 kV or more, the leakage current must be minimized at each portion because the output current value is as small as several μA. For this purpose, the windings of the transformer must be molded with an insulator, and the transformer must be made large in comparison with supply power. This inhibits downsizing and weight reduction of a high-voltage power supply apparatus.

In order to compensate for these drawbacks, it is examined to generate a high voltage by using a flat, light-weight, high-output piezoelectric transformer. By using a piezoelectric transformer formed from ceramic, the piezoelectric transformer can generate a high voltage at higher efficiency than that of the electromagnetic transformer. Electrodes on the primary and secondary sides can be spaced apart from each other regardless of coupling between the primary and secondary sides. Thus, no special molding is necessary for insulation, and the piezoelectric transformer brings an advantage of making a high-voltage generation apparatus compact and lightweight.

Figure 8:
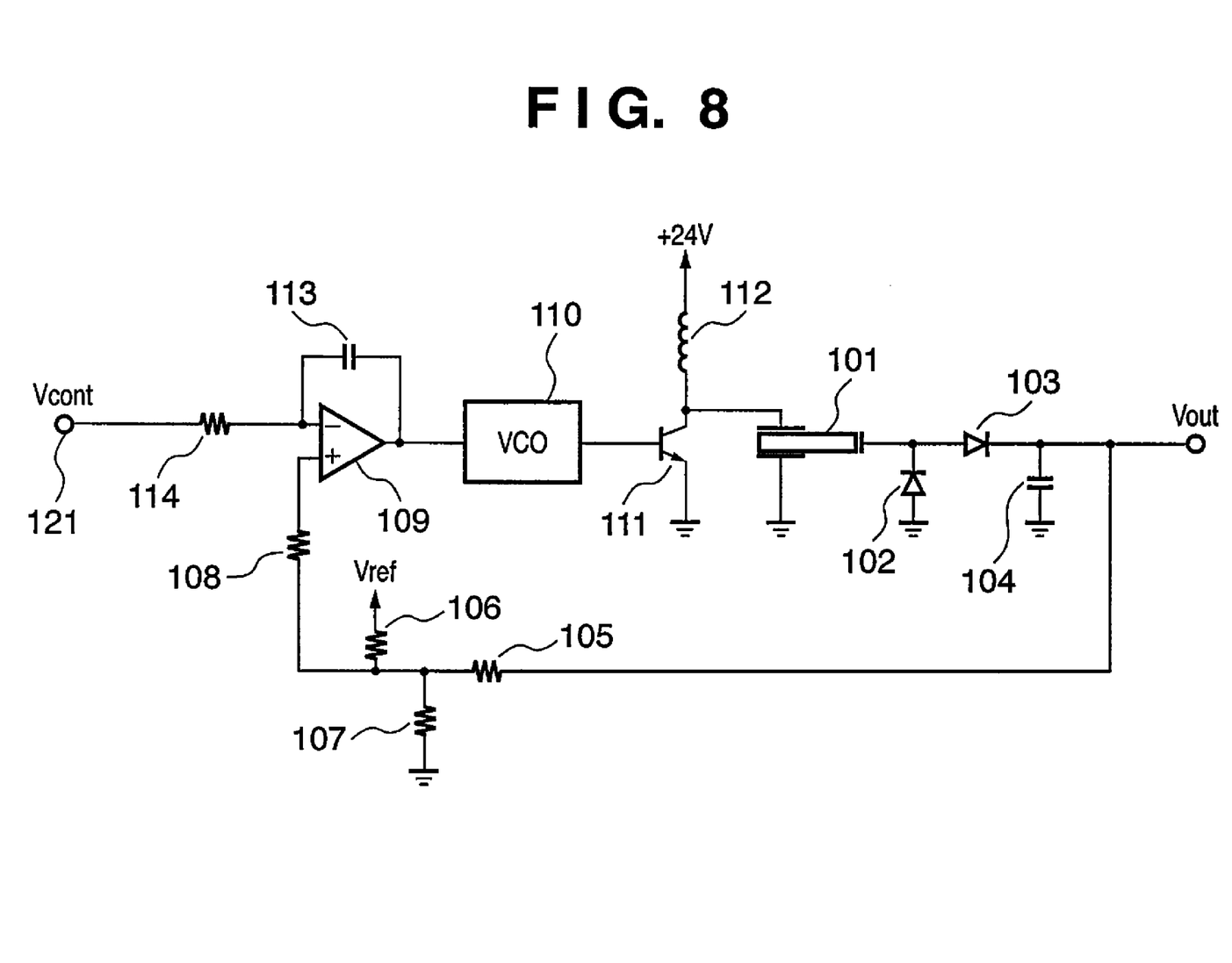
FIG. 8 is a circuit diagram showing the circuit arrangement of a conventional transfer high-voltage power supply using a piezoelectric transformer.

A conventional high-voltage power supply circuit using a piezoelectric transformer will be explained with reference to FIG. 8. In FIG. 8, reference numeral 101 denotes a piezoelectric transformer (piezoelectric ceramic transformer) for a high-voltage power supply. An AC output from the piezoelectric transformer 101 is rectified and smoothed to a positive voltage by diodes 102 and 103 and a high-voltage capacitor 104, and supplied to a transfer roller (not shown) serving as a load. The output voltage is divided by resistors 105, 106, and 107, and input to the non-inverting input terminal (positive terminal) of an operational amplifier 109 via a protection resistor 108. The inverting input terminal (negative terminal) of the operational amplifier receives, via a resistor 114, a high-voltage power supply control signal (Vcont) which serves as an analog signal and is input to a connection terminal 121 from a DC controller 201.

The operational amplifier 109, the resistor 114, and a capacitor 113 are connected as shown in FIG. 8 to construct an integrating circuit. The control signal (Vcont) smoothed by an integral time constant determined by the component constants of the resistor 114 and capacitor 113 is input to the operational amplifier 109. The output terminal of the operational amplifier 109 is connected to a voltage-controlled oscillator (VCO) 110. A transistor 111 whose output terminal is connected to an inductor 112 is driven to apply a power supply voltage to the primary side of the piezoelectric transformer.

The high-voltage power supply unit of an electrophotographic image forming apparatus comprises a plurality of high-voltage power supply circuits using the piezoelectric transformer shown in FIG. 8. The high-voltage power supply circuits correspond to image forming units for, e.g., yellow (Y), magenta (M), cyan (C), and black (K), and output biases for charging, development, transfer, and the like.

An example of the above-described prior art is disclosed in, e.g., Japanese Patent Laid-Open No. 11-206113.

In the prior art, the output voltage is controlled by changing the driving frequency of the piezoelectric transformer. When the output voltage is controlled at a driving frequency higher than the resonance frequency $f_0$, the piezoelectric transformer is driven at a frequency much higher than the resonance frequency, and a frequency serving as a voltage output stop point is controlled in a range where the frequency is much higher than the resonance frequency. Even when no voltage is output from the power supply apparatus, the piezoelectric transformer is driven at a driving frequency much higher than the resonance frequency in the internal circuit of the power supply apparatus. A low output voltage is kept output from the power supply circuit. The voltage is always applied to process members such as the photoconductor and transfer roller, shortening the service life of the process members. Further, power is wasted by driving the piezoelectric transformer.

SUMMARY OF THE INVENTION

The present invention has been proposed to solve the conventional problems, and has as its object to provide a power supply apparatus which uses a piezoelectric transformer, and can prolong the service life of a process member and save power when the power supply apparatus using the piezoelectric transformer is inactive.

To achieve the above object, the power supply apparatus according to the present invention is mainly characterized by comprising the following arrangement.

More specifically a power supply apparatus comprising:

a piezoelectric transformer which outputs a voltage;

a voltage-controlled oscillator which controls a frequency of an output signal in accordance with an input control signal;

a power supply voltage supply element which is driven by a signal output from the voltage-controlled oscillator and applies a power supply voltage to the piezoelectric transformer; and an output voltage stop unit adapted to output a signal for stopping driving the piezoelectric transformer on the basis of the control signal.

Other features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

First Embodiment

Figure 2:
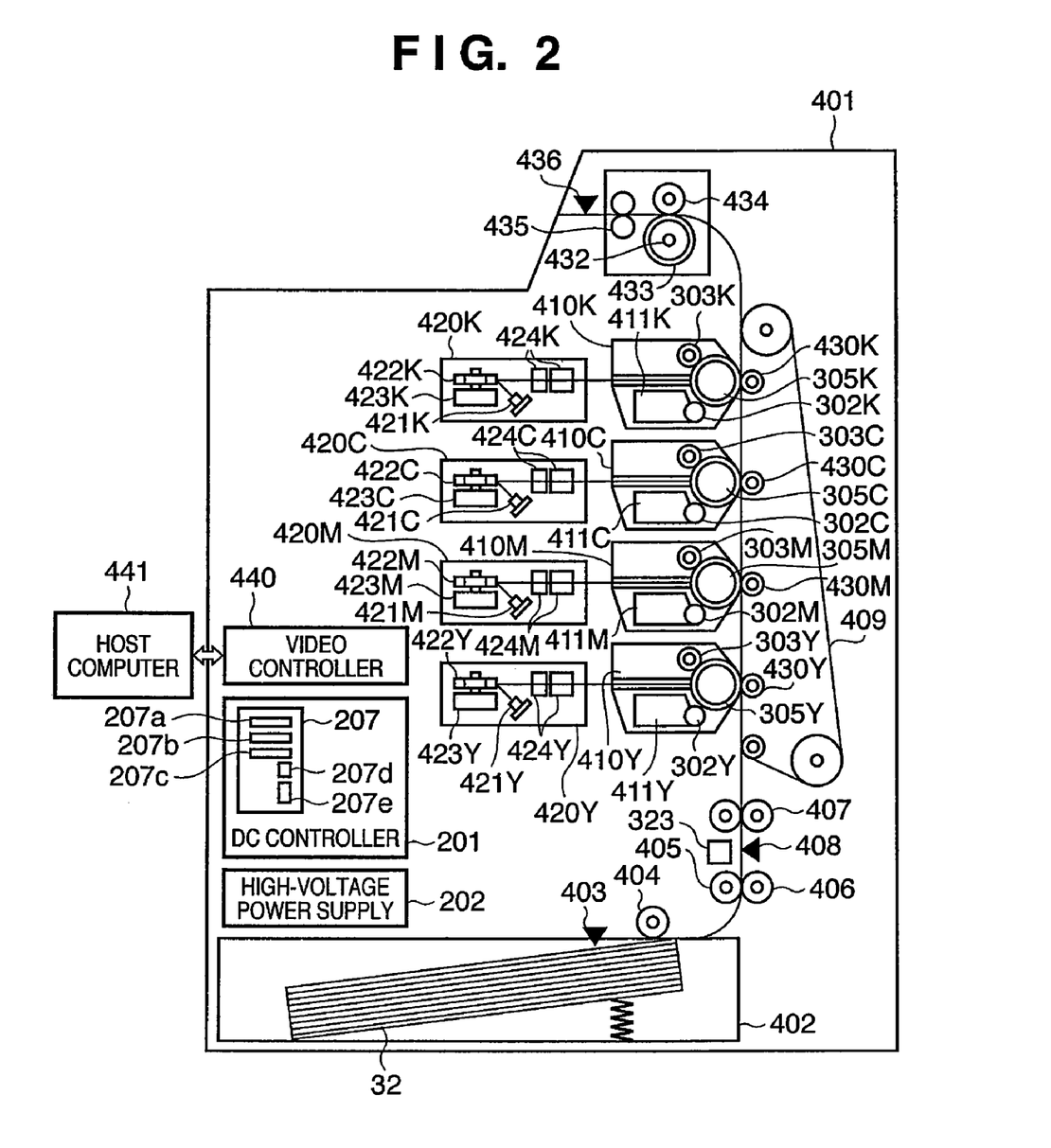
FIG. 2 is a view showing the arrangement of an image forming apparatus having a high-voltage power supply apparatus using a piezoelectric transformer.

The first embodiment of the present invention will be described below with reference to the accompanying drawings. FIG. 2 is a view showing an image forming apparatus (to be referred to as a "color laser printer" hereinafter) having a high-voltage power supply apparatus 202 using a piezoelectric transformer. A color laser printer 401 comprises a deck 402 which stores print sheets 32, a deck sheet presence/absence sensor 403 which detects the presence/absence of the print sheets 32 in the deck 402, and a pickup roller 404 which picks up the print sheet 32 from the deck 402. The color laser printer 401 also comprises a deck sheet feed roller 405 which conveys the print sheet 32 picked up by the pickup roller 404, and a retard roller 406 which is paired with the deck sheet feed roller 405 and prevents multi-feed of the print sheets 32.

A registration roller pair 407 which synchronously conveys the print sheet 32, and a pre-registration sensor 408 which detects conveyance of the print sheet 32 to the registration roller pair 407 are arranged downstream of the deck sheet feed roller 405. An electrostatic chuck/convey/transfer belt (to be referred to as "ETB" hereinafter) 409 is arranged downstream of the registration roller pair 407. Images are formed on the ETB 409 by image forming units made up of process cartridges (410Y, 410M, 410C, and 410K) and scanner units (420Y, 420M, 420C, and 420K) for four colors (yellow (Y), magenta (M), cyan (C), and black (K)). The formed images are sequentially superposed on each other by transfer rollers (430Y, 430M, 430C, and 430K) to form a color image. The color image is transferred onto the print sheet 32. The print sheet 32 bearing the color image is conveyed by a convey mechanism.

A pair of a pressurizing roller 434 and a fixing roller 433 which incorporates a heater 432 in order to thermally fix a toner image transferred on the print sheet 32, a fixing/discharge roller pair 435 which conveys the print sheet 32, and a fixing/discharge sensor 436 which detects conveyance are further arranged on the downstream side.

Each scanner unit 420 comprises a laser unit 421 which emits a laser beam modulated on the basis of an image signal sent from a video controller 440 (to be described later). The scanner unit 420 also comprises a polygon mirror 422, scanner motor 423, and imaging lens group 424 for scanning each photosensitive drum 305 with a laser beam from the laser unit 421.

Each process cartridge 410 comprises the photosensitive drum 305, a charging roller 303, a development roller 302, and a toner storage vessel 411 which are necessary for a known electrophotographic process. The process cartridge 410 is detachable from the color laser printer 401.

The video controller 440 receives image data sent from an external device 441 such as a personal computer (host computer), and bitmaps the image data into bitmap data to generate an image signal for forming an image.

Reference numeral 201 denotes a DC controller serving as the control unit of the laser printer. The DC controller 201 is configured by an MPU (microcomputer) 207, various input/output control circuits (not shown), and the like. The MPU 207 has a RAM 207a, ROM 207b, timer 207c, digital input/output port 207d, and D/A port 207e.

The high-voltage power supply unit (power supply apparatus) 202 is comprised of a charging high-voltage power supply (not shown) and development high-voltage power supply (not shown) which correspond to each process cartridge (410Y, 410M, 410C, or 410K), and a transfer high-voltage power supply which corresponds to each transfer roller 430 and uses a piezoelectric transformer capable of outputting a high voltage.

The arrangement of the transfer high-voltage power supply using the piezoelectric transformer will be explained with reference to FIG. 1. The arrangement of the transfer high-voltage power supply (to be also simply referred to as a "transfer high-voltage power supply" hereinafter) using the piezoelectric transformer according to the first embodiment is effective for both positive- and negative-voltage output circuits. A transfer high-voltage power supply which typically requires a positive voltage will be explained.

The transfer high-voltage power supply includes four circuits in correspondence with the transfer rollers 430Y, 430M, 430C, and 430K for yellow (Y), magenta (M), cyan (C), and black (K). These circuits have the same circuit arrangement, and FIG. 1 illustrates one circuit. However, the gist of the present invention is not limited to one circuit, and can also be applied to the arrangement of a transfer high-voltage power supply having four or more circuits.

Figure 1:
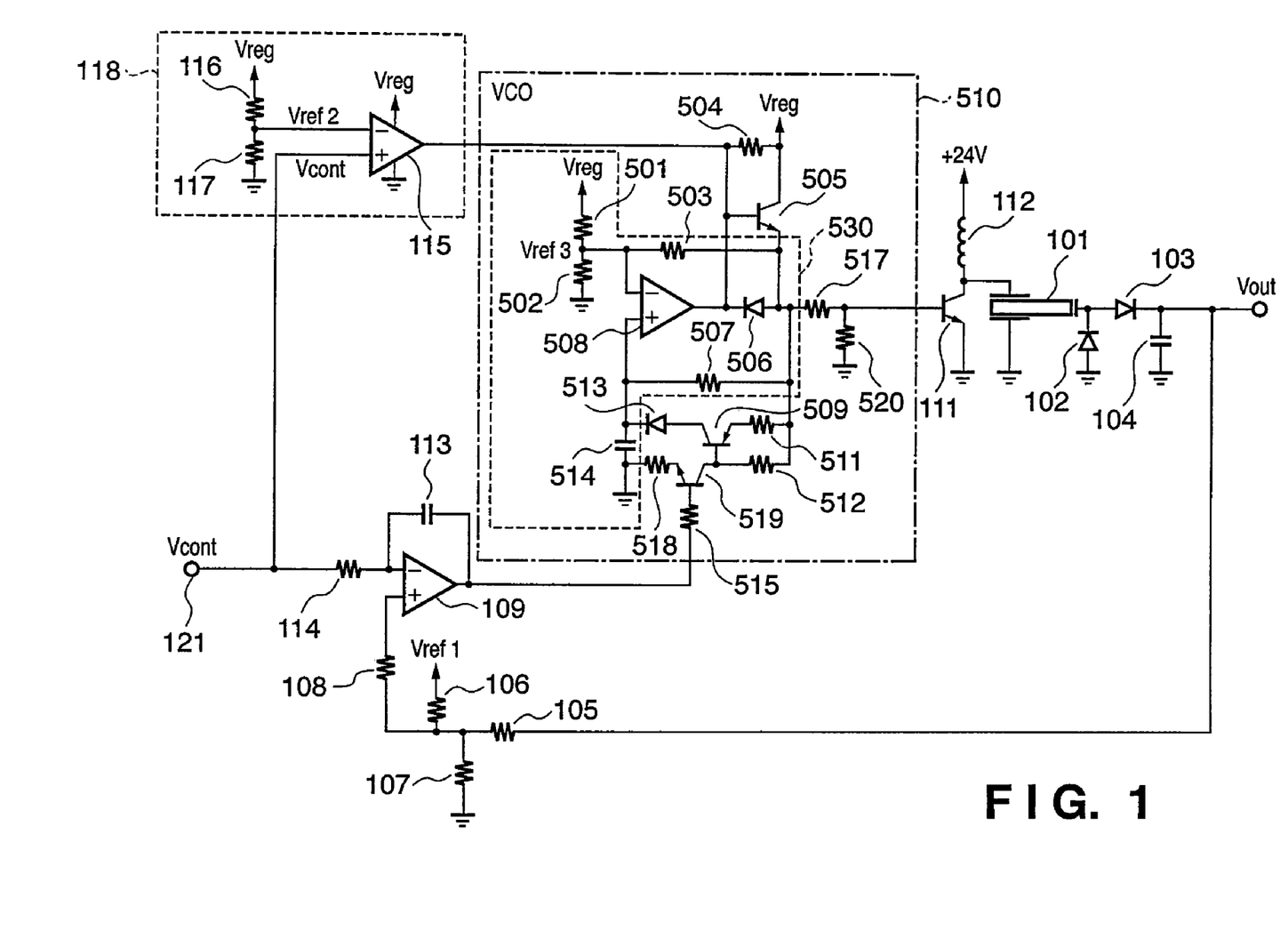
FIG. 1 is a circuit diagram showing the circuit arrangement of a transfer high-voltage power supply using a piezoelectric transformer according to the first embodiment.

In FIG. 1, reference numeral 101 denotes a piezoelectric transformer (piezoelectric ceramic transformer) for a high-voltage power supply. An output from the piezoelectric transformer 101 is rectified and smoothed to a positive voltage by diodes 102 and 103 and a high-voltage capacitor 104, and Vout is supplied to a transfer roller (not shown) serving as a load. The output voltage is divided by resistors 105, 106, and 107, and input to the non-inverting input terminal (positive terminal) of an operational amplifier 109 via a protection resistor 108. The inverting input terminal (negative terminal) of the operational amplifier receives, via a series resistor 114, a high-voltage power supply control signal (Vcont) which serves as an analog signal from the DC controller 201 and is input from a connection terminal 121. The inverting input terminal (negative terminal) of the operational amplifier is connected to an output voltage stop circuit 118 (to be described later) which is made up of a comparator 115 and resistors 116 and 117. The other terminal of the output voltage stop circuit 118 is connected to the output of a comparator 508 which constructs a voltage-controlled oscillator (VCO) 510.

The output terminal of the operational amplifier 109 is connected to the voltage-controlled oscillator 510. The output terminal of the voltage-controlled oscillator 510 is connected to the base of a transistor 111. The collector of the transistor 111 is connected to a power supply (+24 V) via an inductor 112, and connected to one electrode of the piezoelectric transformer 101 on the primary side. The other electrode on the primary side is grounded. The emitter of the transistor 111 is also grounded.

Figure 3:
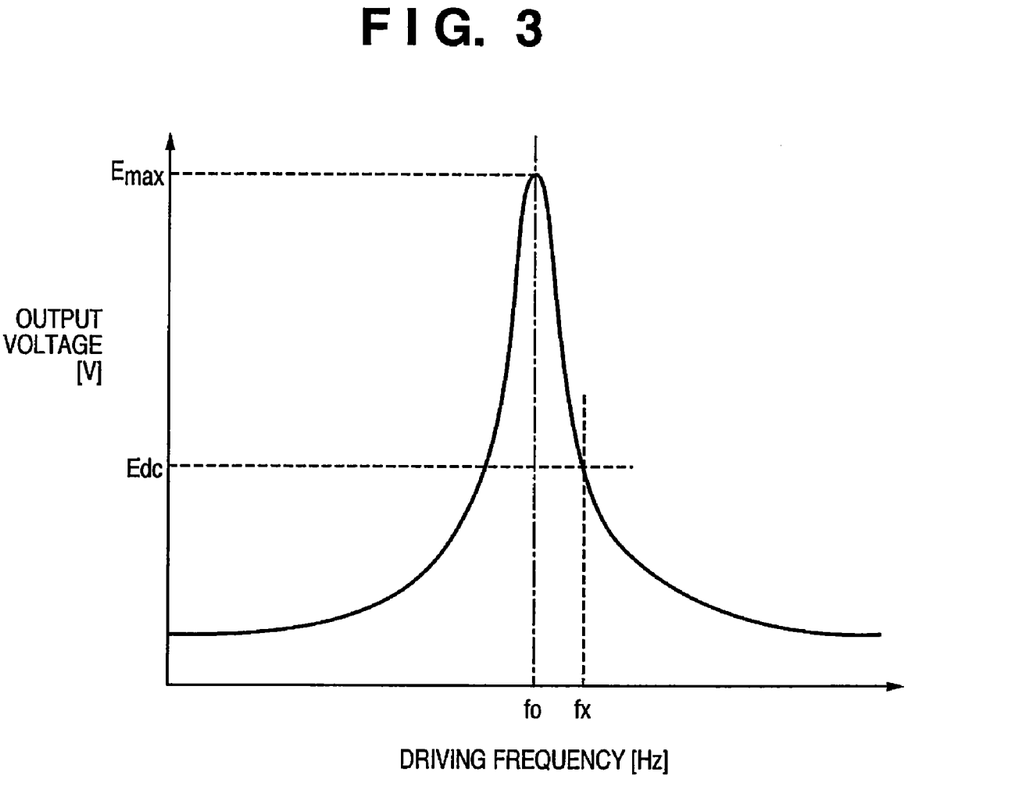
FIG. 3 is a graph showing the relationship between the output voltage (V) and the driving frequency (Hz) as a characteristic of the piezoelectric transformer.

FIG. 3 is a graph showing the relationship between the output voltage (V) and the driving frequency (Hz) as a characteristic of the piezoelectric transformer. As a characteristic of the piezoelectric transformer, the output voltage generally reaches a maximum voltage (Emax) at a resonance frequency $f_0$ as shown in FIG. 3. At a driving frequency fx, the piezoelectric transformer outputs a specified output voltage (to be also referred to as a "control output voltage" hereinafter) Edc. The distribution of the output voltage (V) forms a bell shape using, as the center, the resonance frequency (to be also referred to as a "maximum frequency" hereinafter) $f_0$. By changing the driving frequency, the output voltage can be controlled. For example, to increase the output voltage of the piezoelectric transformer, the driving frequency is changed from a higher driving frequency to a lower one toward the resonance frequency $f_0$. In the following description, control is done at a frequency higher than the resonance frequency $f_0$. The same concept applies to control at a lower frequency.

The voltage-controlled oscillator (VCO) 510 operates to increase the output frequency when the input voltage rises, and decrease it when the input voltage drops. Under this condition, when the control output voltage (Edc) of the piezoelectric transformer 101 rises, an input voltage (Vsns) at the non-inverting input terminal (positive terminal) of the operational amplifier 109 rises via the resistor 105, and the voltage at the output terminal of the operational amplifier 109 rises. Since the input voltage of the voltage-controlled oscillator 510 rises, its output frequency increases, and the driving frequency of the piezoelectric transformer 101 also increases. Hence, the piezoelectric transformer 101 is driven at a frequency higher than the driving frequency fx. Since the output voltage of the piezoelectric transformer 101 drops as the driving frequency fx increases, the output voltage is controlled to a lower one. That is, the arrangement in FIG. 1 forms a negative feedback control circuit.

When the control output voltage (Edc) of the piezoelectric transformer 101 drops, the input voltage (Vsns) of the operational amplifier 109 also drops, and the voltage at the output terminal of the operational amplifier 109 drops. Since the input voltage of the voltage-controlled oscillator 510 drops, its output frequency decreases, and the driving frequency of the piezoelectric transformer 101 also decreases. Since the output voltage of the piezoelectric transformer 101 rises as the driving frequency fx decreases, the output voltage is controlled to a higher one.

In this fashion, the output voltage is controlled to a constant voltage so as to be equal to a voltage determined by the voltage of the control signal (Vcont) which is input from the DC controller 201 to the inverting input terminal (negative terminal) of the operational amplifier 109.

The first embodiment employs a CR oscillation circuit 530 as an oscillation circuit of the voltage-controlled oscillator 510. The internal operation of the voltage-controlled oscillator 510 will be explained mainly about the CR oscillation circuit 530 with reference to FIGS. 1 and 5A to 5C.

Figure 5A:
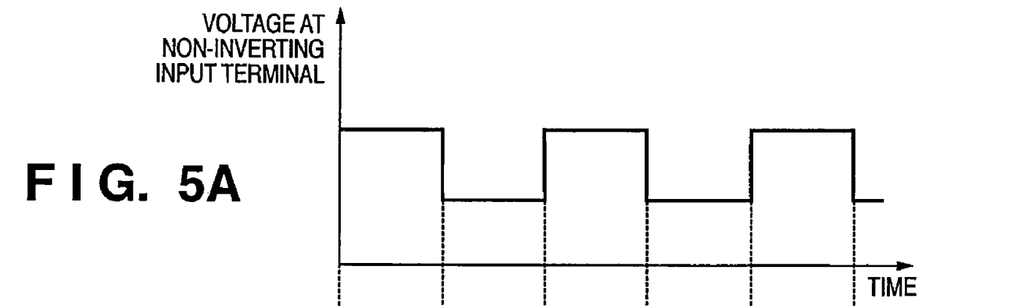
FIGS. 5A to 5C are timing charts showing a change over time in voltages at terminals (non-inverting input terminal, inverting input terminal, and output terminal) in a comparator 508.
Figure 5B:
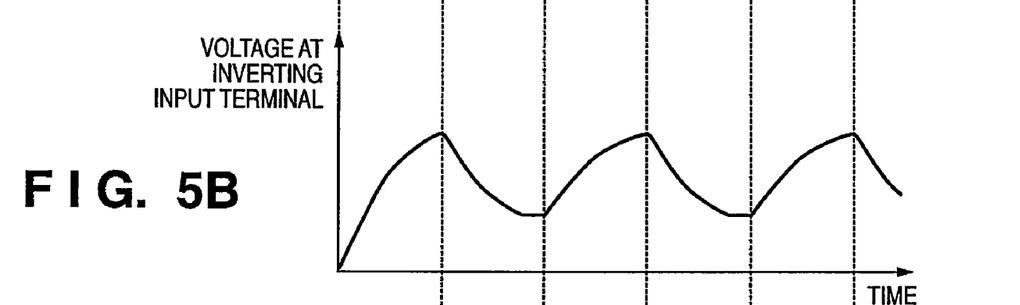
Figure 5C:
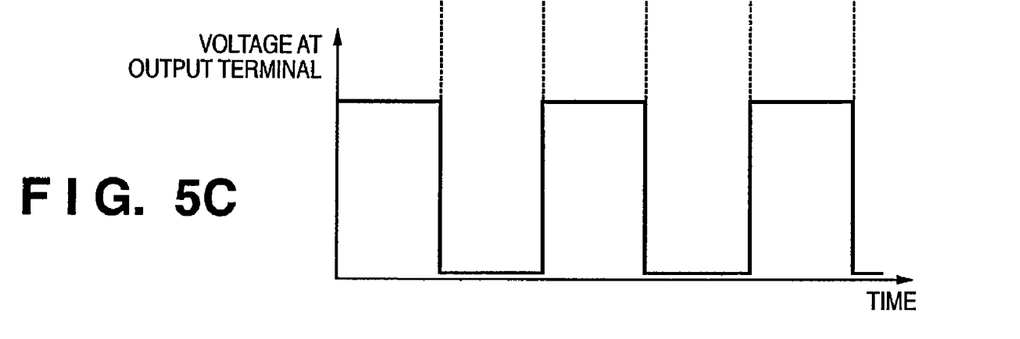

The CR oscillation circuit 530 is made up of the comparator 508, a capacitor 514, and resistors 501, 502, 503, and 507. The capacitor 514 is charged and discharged in a cycle determined by the CR time constants of the capacitor 514 and resistor 507. FIGS. 5A to 5C show a change over time in voltages at terminals (non-inverting input terminal (positive terminal), inverting input terminal (negative terminal), and output terminal) in the comparator 508. The transistor 111 is switched by an output from the CR oscillation circuit 530, i.e., the output voltage of the comparator 508. Transistors 509 and 519, a diode 513, and resistors 511, 512, 515, and 518 are used to finely adjust the frequency of the CR oscillation circuit 530 in accordance with the output voltage of the operational amplifier 109 and feedback-control the output voltage (Vout). The output voltage of the operational amplifier 109 is the feedback voltage of the output voltage (Vout).

As remaining elements which configure the voltage-controlled oscillator 510, a transistor 505, resistor 504, and diode 506 are used to quickly raise the base voltage of the transistor 111. Resistors 517 and 520 are necessary to charge/discharge the input capacitor (not shown) of the transistor 111. The above building components are not directly related to the gist of the present invention, and a detailed description thereof will be omitted.

The output voltage stop means (output voltage stop circuit 118) as a feature of the first embodiment will be explained with reference to FIGS. 1, 3, and 4 by comparing the circuit arrangement of the first embodiment with the conventional one (FIG. 8).

The power supply apparatus (202) according to the first embodiment comprises a piezoelectric transformer which outputs a voltage, a rectification element which rectifies and smoothes a voltage output from the piezoelectric transformer in accordance with the load and outputs the resultant voltage, and a voltage-controlled oscillator which controls the frequency of an output signal in accordance with an input control signal. The power supply apparatus (202) also comprises a power supply voltage supply element which is driven by a signal output from the voltage-controlled oscillator and applies a power supply voltage to the piezoelectric transformer. The power supply apparatus (202) having the above arrangement comprises an output voltage stop means (output voltage stop circuit 118) which receives the control signal (Vcont) and outputs a signal based on a comparison between the control signal (Vcont) and a reference voltage (Vref2). The output voltage stop means has a comparison circuit, and can compare the control signal and reference voltage. The voltage-controlled oscillator (510) in the power supply apparatus (202) stops, in accordance with a signal output from the output voltage stop means (output voltage stop circuit 118), the driving element (111) which drives the piezoelectric transformer 101.

The power supply apparatus (202) comprises, as a piezoelectric transformer control circuit, a piezoelectric transformer (101), a circuit (driving circuit) which controls the driving frequency of the piezoelectric transformer in accordance with a control signal for controlling the output voltage of the piezoelectric transformer, and a circuit (stop circuit) which stops driving the piezoelectric transformer on the basis of the control signal.

When the control signal corresponds to a voltage lower than a predetermined value, the stop circuit stops driving the piezoelectric transformer (101).

The piezoelectric transformer control circuit comprises an oscillator which outputs an oscillation signal whose frequency changes in accordance with a control signal, and a driving element which drives the piezoelectric transformer on the basis of the oscillation signal output from the oscillator. The stop circuit stops the operation of the driving element which drives the piezoelectric transformer regardless of the oscillation signal.

The stop circuit can also stop the oscillator when the control signal is smaller than the reference voltage.

The output voltage stop circuit 118 inputs, to the output side of the CR oscillation circuit 530 via the comparator 115, the comparison result between a power supply voltage (Vreg) of the control system, the reference voltage (Vref2) generated by the resistors 116 and 117, and the control signal (Vcont).

Figure 4:
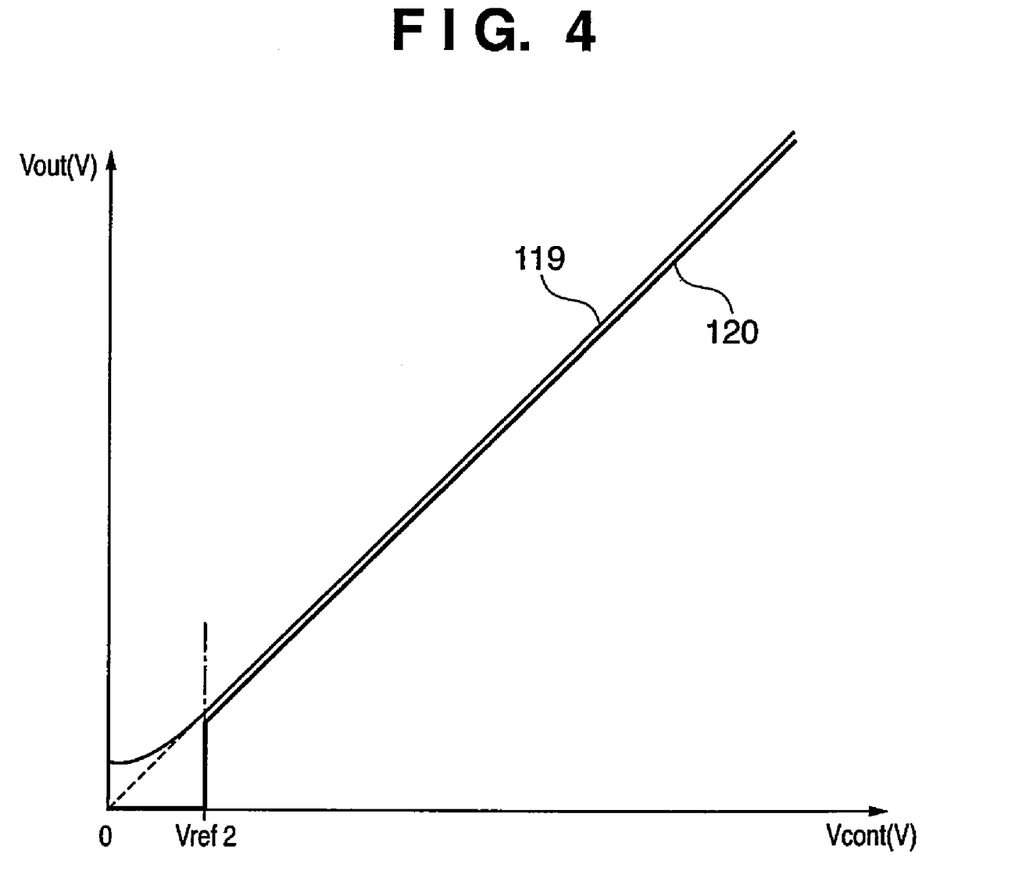
FIG. 4 is a graph showing the change (input/output characteristic) of an output voltage (Vout) as a function of a control signal (Vcont)

FIG. 4 is a graph showing the change (input/output characteristic) of the output voltage (Vout) to the control signal (Vcont). In FIG. 4, 119 represents an input/output characteristic in the conventional circuit arrangement, and 120 represents an input/output characteristic in the circuit arrangement according to the first embodiment. In the conventional circuit arrangement, even when the control signal (Vcont) is 0, the piezoelectric transformer 101 is driven at a frequency much higher than the resonance frequency $f_0$ in FIG. 3, and the output voltage (Vout) is not completely 0.

To the contrary, in the circuit arrangement of the first embodiment, when the control signal (Vcont) is smaller than the reference voltage (Vref2), the output voltage stop circuit 118 changes, to Low, a signal output from the comparator 115 of the output voltage stop circuit 118. The Low signal output from the output voltage stop circuit 118 is input to the CR oscillation circuit 530 to stop oscillation of the voltage-controlled oscillator 510. Then, oscillation of the base potential of the transistor 111 serving as a driving element for driving the piezoelectric transformer 101 stops. In response to this, driving of the piezoelectric transformer 101 also stops, and the output voltage (Vout) of the power supply apparatus becomes completely 0.

When the control signal (Vcont) is larger than the reference voltage (Vref2), the comparator 115 of the output voltage stop circuit 118 does not switch the output from High to Low, and inputs an output result complying with the control signal (Vcont) to the output side of the CR oscillation circuit 530, similar to the prior art.

The output voltage stop circuit 118 can stop the output voltage (Vout) of the power supply apparatus to completely 0 in a control signal range where the control signal (Vcont) is smaller than the reference voltage (Vref2). Since the output voltage (Vout) becomes completely 0, the burden on a load (process member) to which the output voltage is applied can be reduced to prolong the service life of the process member.

Oscillation of the voltage-controlled oscillator 510 is stopped in the control signal range where the control signal (Vcont) is smaller than the reference voltage (Vref2). Power consumption of driving elements (e.g., the voltage-controlled oscillator 510, transistor 111, and inductor 112) can be reduced.

Second Embodiment

Figure 6:
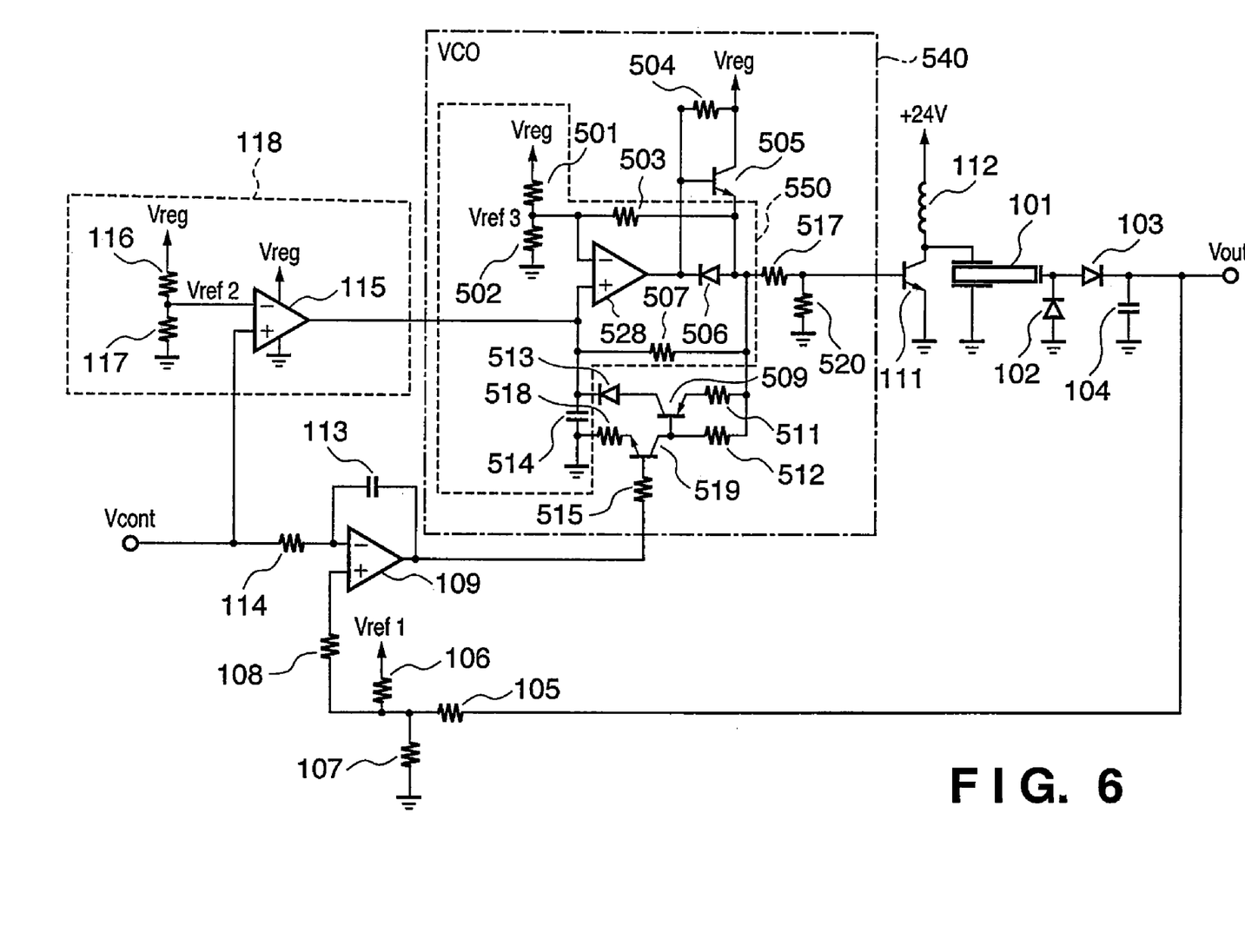
FIG. 6 is a circuit diagram showing the circuit arrangement of a transfer high-voltage power supply using a piezoelectric transformer according to the second embodiment of the present invention.

FIG. 6 is a circuit diagram showing the circuit arrangement of a transfer high-voltage power supply using a piezoelectric transformer according to the second embodiment of the present invention. Note that a description of the same building components as those described in the first embodiment will be omitted. The second embodiment is mainly different from the first embodiment in a location where an output voltage stop means (output voltage stop circuit 118) is connected to a voltage-controlled oscillator (VCO) 540. In the first embodiment, the output voltage stop circuit 118 is connected to the output side of the CR oscillation circuit 530 which configures the voltage-controlled oscillator 510. In the second embodiment, the output voltage stop circuit 118 is connected to the input side of a CR oscillation circuit 550.

When the control signal (Vcont) is smaller than the reference voltage (Vref2), the output voltage stop circuit 118 changes, to Low, an output from a comparator 115 of the output voltage stop circuit 118. When the control signal (Vcont) is larger than the reference voltage (Vref2), the comparator 115 of the output voltage stop circuit 118 does not switch the output from High to Low, and inputs an output result complying with the control signal (Vcont) to the CR oscillation circuit 530.

In the control signal range where the control signal (Vcont) is smaller than the reference voltage (Vref2), the output voltage stop circuit 118 inputs a Low output to the CR oscillation circuit 550 to stop charge/discharge of a capacitor 514 in the CR oscillation circuit 550. The output voltage stop circuit 118 stops oscillation of the voltage-controlled oscillator (VCO) 540, and stops oscillation of the base potential of a transistor 111. As a result, driving of the piezoelectric transformer 101 also stops, and the output voltage (Vout) of the power supply apparatus becomes completely 0.

From a comparison between the circuit arrangement (FIG. 1) according to the first embodiment and that (FIG. 6) according to the second embodiment, the input terminals of a comparator 528 (FIG. 6) are set opposite to those of the comparator 508 (FIG. 1). This is because an output from the comparator 528 is changed to Low when the output voltage stop circuit 118 operates (an output from the output voltage stop circuit 118 is Low). When the output voltage (Vout) becomes completely 0, wasteful power consumption by a resistor 520 and the transistor 111 can be prevented.

Even when the output voltage stop circuit 118 is connected to the input terminal of the CR oscillation circuit 550, the output voltage (Vout) can become completely 0 in the control signal range where the control signal (Vcont) is smaller than the reference voltage (Vref2). The burden on a load (process member) to which the output voltage (Vout) is applied can be reduced to prolong the service life of the process member.

Oscillation of the voltage-controlled oscillator 540 is stopped in the control signal range where the control signal (Vcont) is smaller than the reference voltage (Vref2). Power consumption of driving elements (e.g., the voltage-controlled oscillator 540, the transistor 111, and an inductor 112) can be reduced.

Third Embodiment

Figure 7:
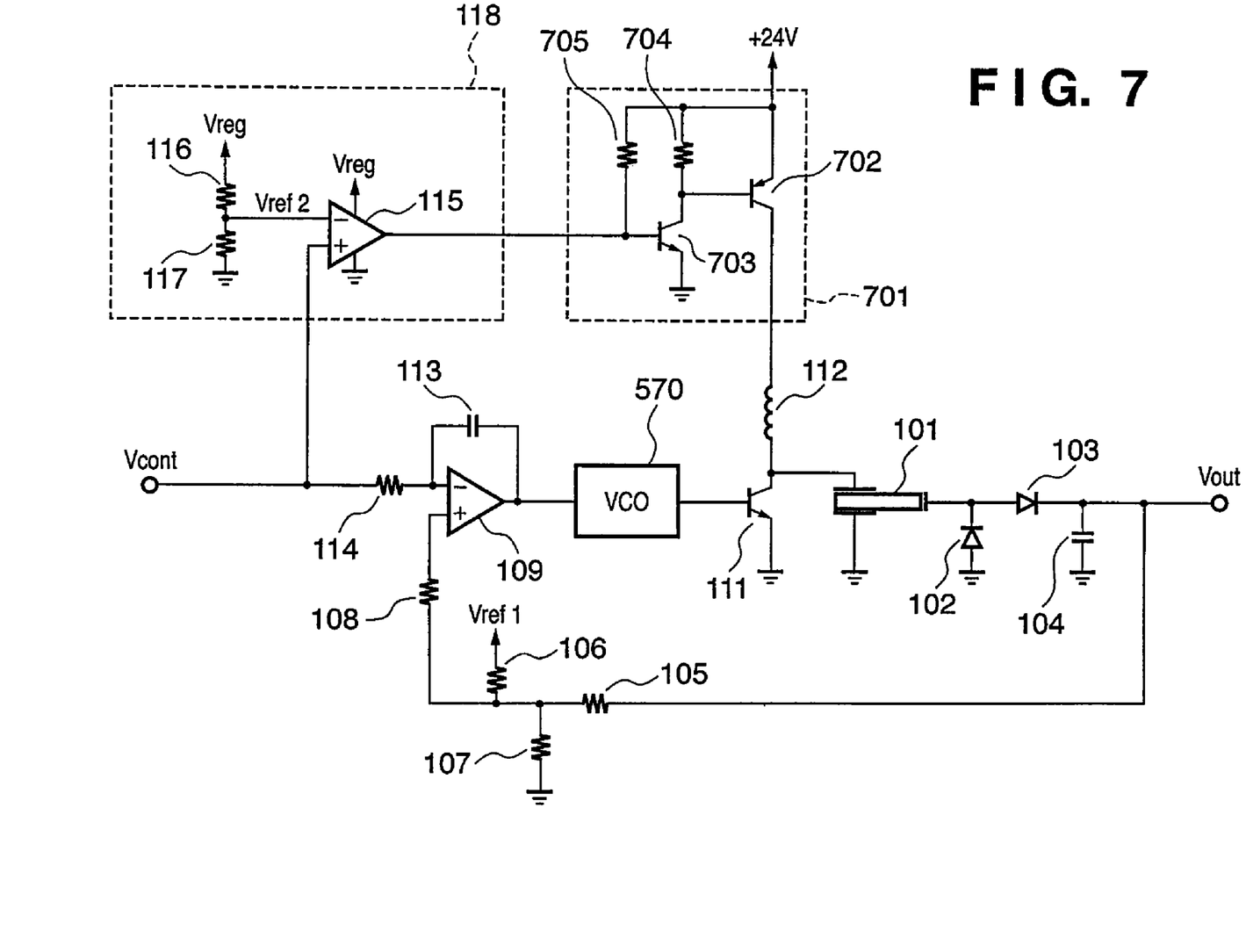
FIG. 7 is a circuit diagram showing the circuit arrangement of a transfer high-voltage power supply using a piezoelectric transformer according to the third embodiment of the present invention.

FIG. 7 is a circuit diagram showing the circuit arrangement of a transfer high-voltage power supply using a piezoelectric transformer according to the third embodiment of the present invention. Note that a description of the same building components as those described in the first and second embodiments will be omitted. The third embodiment is different from the first and second embodiments in that supply of power (driving voltage) for driving a piezoelectric transformer 101 is stopped using an output voltage stop means (output voltage stop circuit 118) and a switching means (switching circuit 701) to stop the output voltage (Vout) to completey 0.

In accordance with a signal output from the output voltage stop means (output voltage stop circuit 118), the switching means (switching circuit 701) can apply or stop a driving voltage to a driving element (transistor 111) for driving the piezoelectric transformer 101.

The arrangement and operation of the output voltage stop circuit 118 have been described in the first and second embodiments, and a detailed description thereof will be omitted. The operation of the switching circuit 701 will be explained in detail.

When the control signal (Vcont) input to the output voltage stop circuit 118 is larger than the reference voltage (Vref2), a comparator 115 outputs a High-level signal to the switching circuit 701 to turn on a transistor 703 of the switching circuit 701. The base potential of a transistor 702 decreases to almost 0, and the transistor 702 is turned on. In other words, the piezoelectric transformer 101 can be driven by driving the transistor 111 connected to an inductor 112.

If a signal output when the control signal (Vcont) is smaller that the reference voltage is input to the switching means (switching circuit 701), the switching circuit 701 stops supply of the driving voltage to the driving element (transistor 111) which drives the piezoelectric transformer 101.

In FIG. 7, when the control signal (Vcont) input to the output voltage stop circuit 118 is smaller than the reference voltage (Vref2), the comparator 115 outputs a Low-level signal to the switching circuit 701 to turn off the transistor 703 of the switching circuit 701. The base potential of the transistor 702 remains at 24 V. Since the transistor 702 is OFF, no power is supplied to the inductor 112 and transistor 111 serving as driving units of the piezoelectric transformer 101. That is, when the control signal (Vcont) input to the output voltage stop circuit 118 is smaller than the reference voltage (Vref2), the output voltage stop circuit 118 and switching circuit 701 can stop supply of power (driving voltage) to the driving unit of the piezoelectric transformer 101. Accordingly, driving of the piezoelectric transformer 101 is stopped, and the output voltage (Vout) of the power supply apparatus can become completely 0.

Since the output voltage (Vout) becomes completely 0, the burden on a load (process member) to which the output voltage is applied can be reduced to prolong the service life of the process member. Oscillation of a voltage-controlled oscillator 570 is stopped in the control signal range where the control signal (Vcont) is smaller than the reference voltage (Vref2). Power consumption of driving elements (e.g., the voltage-controlled oscillator 570, transistor 111, and inductor 112) can be reduced.

The first to third embodiments have described the image forming apparatus by exemplifying a transfer high-voltage power supply used for a color image forming apparatus of a tandem system. However, the gist of the present invention can be applied to any image forming apparatus using a high-voltage bias.

The image forming apparatus comprises the above-described power supply apparatus, and an image forming unit which forms an image by a voltage output generated by the power supply apparatus. The image forming unit forms an image by an electrophotographic process. The power supply apparatus generates a power supply voltage for at least one of a charger for charging a photoconductor, a developing device, and a transfer charger for transferring a toner image from the photoconductor.

The image forming apparatus comprises image forming stations for a plurality of colors (e.g., Y, M, C, and K), and a plurality of power supply apparatuses which individually correspond to the image forming stations for these colors.

As an application target of the present invention, the image forming apparatus is not limited to a color image forming apparatus, and may be a monochrome image forming apparatus which forms a monochrome image. The circuit arrangement in any one of FIGS. 1, 6, and 7 can be applied to the power supply apparatus in the image forming apparatus. In this case, in processes such as charging, development, and transfer, the output voltage (Vout) of the power supply apparatus can become completely 0 in the control signal range where the control signal (Vcont) is smaller than the reference voltage (Vref2). This can prolong the service life of a process member and save power when the power supply apparatus using the electromagnetic transformer is inactive.

As many apparently widely different embodiments of the present invention can be made without departing from the spirit and scope thereof, it is to be understood that the invention is not limited to the specific embodiments thereof except as defined in the claims.

This application claims the benefit of Japanese Application No. 2005-166166, filed Jun. 6, 2005, which is hereby incorporated by reference herein in its entirety.

What is claimed is:

1. A power supply apparatus comprising:
a piezoelectric transformer which outputs a voltage;
a voltage-controlled oscillator which controls a frequency of an output signal in accordance with an input control signal;
a power supply voltage supply element which is driven by a signal output from said voltage-controlled oscillator and applies a power supply voltage to said piezoelectric transformer; and
an output voltage stop unit adapted to output a signal for stopping driving said piezoelectric transformer on the basis of the control signal.

2. The apparatus according to claim 1, wherein said output voltage stop unit comprises a comparison circuit which compares the control signal with a reference voltage.

3. The apparatus according to claim 1, wherein said voltage-controlled oscillator stops, in accordance with the signal output from said output voltage stop unit, operation of a driving element which drives said piezoelectric transformer.

4. The apparatus according to claim 1, further comprising a rectification element which rectifies and smoothes the voltage output from said piezoelectric transformer.

5. The apparatus according to claim 1, wherein when the control signal is smaller than a reference voltage, said output voltage stop unit outputs, to said voltage-controlled oscillator, the signal for stopping operation of a driving element which drives said piezoelectric transformer.

6. The apparatus according to claim 1, further comprising a switching unit adapted to supply a driving voltage to a driving element which drives said piezoelectric transformer, or stop supply of the driving voltage in accordance with the signal output from said output voltage stop unit.

7. The apparatus according to claim 6, wherein for a signal output when the control signal is smaller than a reference voltage, said switching unit stops supply of the driving voltage to the driving element which drives said piezoelectric transformer.

8. The apparatus according to claim 1, wherein said voltage-controlled oscillator stops oscillation in accordance with a signal output from said output voltage stop unit.

9. An image forming apparatus comprising:
a power supply apparatus defined in claim 1; and
an image forming unit adapted to form an image by a voltage output generated by said power supply apparatus.

10. The apparatus according to claim 9, wherein said image forming unit forms an image by an electrophotographic process.

11. A piezoelectric transformer control circuit comprising:
a piezoelectric transformer;
a driving circuit which controls a driving frequency of said piezoelectric transformer in accordance with a control signal for controlling a voltage output from said piezoelectric transformer; and
a stop circuit which stops driving said piezoelectric transformer on the basis of the control signal.

12. The circuit according to claim 11, wherein when the control signal corresponds to a voltage smaller than a predetermined value, said stop circuit stops diving said piezoelectric transformer.

13. The circuit according to claim 11, further comprising:
an oscillator which outputs an oscillation signal whose frequency changes in accordance with the control signal; and
a driving element which drives said piezoelectric transformer on the basis of the oscillation signal output from said oscillator,
wherein said stop circuit stops, regardless of the oscillation signal, operation of said driving element which drives said piezoelectric transformer.

14. The circuit according to claim 11, wherein said stop circuit stops said oscillator when the control signal is smaller than a reference voltage.

15. A power supply apparatus comprising:
a piezoelectric transformer control circuit defined in claim 11; and
a rectification element which rectifies and smoothes a voltage output from a piezoelectric transformer.

16. An image forming apparatus comprising:
a power supply apparatus defined in claim 15; and
an image forming unit which forms an image by a voltage output generated by said power supply apparatus.

17. The apparatus according to claim 16, wherein said image forming unit forms an image by an electrophotographic process.

18. The apparatus according to claim 17, wherein said power supply apparatus generates a power supply voltage for at least one of a charger for charging a photoconductor, a developing device, and a transfer charger for transferring a toner image from the photoconductor.

19. The apparatus according to claim 17, further comprising image forming stations for a plurality of colors, and a plurality of power supply apparatuses which individually correspond to said image forming stations for the plurality of colors.

20. The apparatus according to claim 19, wherein each of said plurality of power supply apparatuses which individually correspond to said image forming stations for the plurality of colors generates a power supply voltage for at least one of a charger for charging a photoconductor, a developing device, and a transfer charger for transferring a toner image from the photoconductor.

* * * * *